(12) United States Patent
McBride

(10) Patent No.: US 6,449,578 B1
(45) Date of Patent: Sep. 10, 2002

(54) METHOD AND APPARATUS FOR DETERMINING THE RC DELAYS OF A NETWORK OF AN INTEGRATED CIRCUIT

(75) Inventor: John G McBride, Ft Collins, CO (US)

(73) Assignee: Hewlett-Packard Company, Palo Alto, CA (US)

( * ) Notice: Subject to any disclaimer, the term of this patent is extended or adjusted under 35 U.S.C. 154(b) by 0 days.

(21) Appl. No.: 09/345,655

(22) Filed: Jun. 30, 1999

(51) Int. Cl.[7] ................................................ G06F 19/00
(52) U.S. Cl. ............................ 702/119; 716/6; 702/182
(58) Field of Search ................................ 702/180, 187, 702/71, 60, 61, 64, 65, 66, 67, 68, 69, 119; 716/6, 4, 5, 11, 15, 16

(56) References Cited

U.S. PATENT DOCUMENTS

| | | | |
|---|---|---|---|
| 5,880,967 A | * | 3/1999 | Jyu et al. .................. 716/6 |
| 5,923,564 A | * | 7/1999 | Jones, Jr. .................. 716/6 |
| 5,966,521 A | * | 10/1999 | Takeuchi et al. ............. 716/6 |
| 6,158,022 A | * | 12/2000 | Avidan ..................... 714/33 |

* cited by examiner

Primary Examiner—Marc S. Hoff
Assistant Examiner—Mohamed Charioui

(57) ABSTRACT

The present invention provides a method and apparatus for determining the RC delays of a network comprised in an integrated circuit. The apparatus comprises logic configured to execute a rules checker algorithm. The rules checker algorithm operates in conjunction with a static timing analyzer. The static timing analyzer reads a netlist. The rules checker algorithm utilizes information relating to the netlist to generate a Spice deck which defines a circuit to be simulated. In the Spice deck, the driver gates of the network are replaced with ramp function voltage sources. The Spice deck includes the parasitic resistances and capacitance associated with the network. Once the Spice deck has been generated, the rules checker program calls a Spice simulation routine, which simulates the circuit defined by the Spice deck. The Spice routine generates a Spice results file that comprises voltage waveform information relating to the simulation. The rules checker algorithm utilizes this waveform information to determine the RC delays of the network. The determined RC delays may be utilized to determine whether or not the network meets maximum allowable RC delay specifications.

14 Claims, 7 Drawing Sheets

METHOD AND APPARATUS FOR DETERMINING THE RC DELAYS OF A NETWORK OF AN INTEGRATED CIRCUIT

TECHNICAL FIELD OF THE INVENTION

The present invention generally relates to computer-aided circuit design systems and, more particularly, to a method and apparatus for evaluating the design quality of a network of nodes in an integrated circuit to determine the RC delays of the network.

BACKGROUND OF THE INVENTION

Integrated circuits are electrical circuits comprised of transistors, resistors, capacitors, and other components comprised on a single semiconductor "chip" in which the components are interconnected to perform a given function. Typical examples of integrated circuits include, for example, microprocessors, programmable logic devices (PLDs), electrically erasable programmable memory devices (EEPROMs), random access memory devices (RAMs), operational amplifiers and voltage regulators. A circuit designer typically designs the integrated circuit by using very large scale integrated (VLSI) circuit design techniques to create a circuit schematic which indicates the electrical components and their interconnections. Often, designs are simulated by computer to verify functionality and to ensure that performance goals are satisfied.

In the world of electrical device engineering, the design and analysis work involved in producing electronic devices is often performed using electronic computer aided design (E-CAD) tools. As will be appreciated by those skilled in the art, electronic devices include electrical analog, digital, mixed hardware, optical, electro-mechanical, and a variety of other electrical devices. The design and the subsequent simulation of any circuit board, VLSI chip, or other electrical device via E-CAD tools allows a product to be thoroughly tested and often eliminates the need for building a prototype. Thus, today's sophisticated E-CAD tools may enable the circuit manufacturer to go directly to the manufacturing stage without having to perform costly, time consuming prototyping.

In order to perform the simulation and analysis of a hardware device, E-CAD tools must deal with an electronic representation of the hardware device. A "netlist" is one common representation of a hardware device. As will be appreciated by those skilled in the art of hardware device design, a "netlist" is a detailed circuit specification used by logic synthesizers, circuit simulators and other circuit design optimization tools. A netlist typically comprises a list of circuit components and the interconnections between those components.

The two forms of a netlist are the flat netlist and the hierarchical netlist. Often, a netlist will contain a number of circuit "modules" which are used repetitively throughout the larger circuit. A flat netlist will contain multiple copies of the circuit modules essentially containing no boundary differentiation between the circuit modules and other components in the device. By way of analogy, one graphical representation of a flat netlist is simply the complete schematic of the circuit device.

In contrast, a hierarchical netlist will only maintain one copy of a circuit module which may be used in multiple locations. By way of analogy, one graphical representation of a hierarchical netlist would show the basic and/or non-repetitive devices in schematic form and the more complex and/or repetitive circuit modules would be represented by "black boxes." As will be appreciated by those skilled in the art, a black box is a system or component whose inputs, outputs, and general function are known, but whose contents are not shown. These "black box" representations, hereinafter called "modules", will mask the complexities therein, typically showing only input/output ports.

An integrated circuit design can be represented at different levels of abstraction, such as the Register-Transfer level (RTL) and the logic level, using a hardware description language (HDL). VHDL and Verilog are examples of HDL languages. At any abstraction level, an integrated circuit design is specified using behavioral or structural descriptions, or a mix of both. At the logical level, the behavioral description is specified using boolean equations. The structural description is represented as a netlist of primitive cells. Examples of primitive cells are full-adders, NAND gates, latches, and D-Flip Flops.

Having set forth some very basic information regarding the representation of integrated circuits and other circuit schematics through netlists, systems are presently known that use the information provided in netlists to evaluate circuit timing and other related parameters. More specifically, systems are known that perform a timing analysis of circuits using netlist files. Although the operational specifics may vary from system to system, generally such systems identify certain critical timing paths, and then evaluate the circuit to determine whether timing violations may occur through the critical paths. As is known, timing specifications may be provided to such systems by way of a configuration file.

One such system known in the prior art is marketed under the name PathMill, by EPIC Design Technology, Inc., subsequently purchased by Synopsis, Inc. PathMill is a transistor-based analysis tool used to find critical paths and to verify timing in semiconductor designs. Using static and mixed-level timing analysis, PathMill processes transistors, gates, and timing models. It also calculates timing delays, performs path searches, and checks timing requirements. As is known, PathMill can analyze combinational designs containing gates, and sequential designs containing gates, latches, flip-flops, and clocks. Combinational designs are generally measured through the longest and shortest paths.

While tools such as these are useful for the design verification process after layout, there are various shortcomings in the PathMill product and other similar products. One primary shortcoming of the PathMill program is that it does not analyze the circuits to determine the design quality of the circuits. Rather, PathMill performs a static timing analysis of a circuit using the netlist provided to PathMill. Furthermore, configuring PathMill to recognize various circuit characteristics is typically a very difficult task.

Accordingly, a need exists for a rules checking system that will allow circuits to be evaluated for design quality. The present invention works in conjunction with a tool, such as, for example, PathMill, to build a database which is then utilized by the rules checking system of the present invention to evaluate the design quality of network nodes. Typically, such tools, including PathMill, receive a netlist and use the netlist to determine FET (field effect transistor) direction, node types, latches, dynamic gates, rise and fall times, etc. This information is utilized by the present invention to build a database which is then utilized by the rules checking system of the present invention to evaluate the design quality of network nodes, preferably of network nodes of FET-level circuits designed in accordance with VLSI techniques.

In accordance with the present invention, the rules checking system evaluates the design quality of networks of nodes in an integrated circuit to determine the RC delays of the networks. Integrated circuits can be viewed as networks of drivers and receivers. A driver is a gate comprised of a plurality of FETs which drives another gate which is also comprised of a plurality of FETs. The gate being driven is commonly referred to as the receiver. The driver and receiver gates may be, for example, inverters. The input to the receiver gate corresponds to the input node of the network and the outputs of the driver gates correspond to the output nodes of the network.

Design specifications for clocked networks in integrated circuits typically specify the maximum allowable RC delays between the output nodes of the network and the input node of the network. Accordingly, a need exists for a rules checking system that will allow these networks to be evaluated to determine whether or not the RC delays of the networks meet these design specifications.

SUMMARY OF THE INVENTION

The present invention provides a method and apparatus for determining the RC delays of a network comprised in an integrated circuit. The apparatus comprises logic configured to execute a rules checker algorithm. When the rules checker algorithm is executed by the logic, the algorithm analyzes information relating to the network and determines the RC delays between the output nodes of the network and the input node of the network. Once the RC delays have been determined, a determination can be made as to whether or not the RC delays meet design specifications relating to maximum allowable RC delays for the network.

In accordance with the preferred embodiment of the present invention, the rules checker algorithm operates in conjunction with a static timing analyzer to build a database, which is then utilized by the rules checker algorithm to determine the RC delays. The static timing analyzer reads a netlist. Information associated with the netlist is comprised in the database. The rules checker algorithm utilizes this information to generate a Spice deck that defines a circuit to be simulated. In the Spice deck, the driver gates of the network are replaced with ramp function voltage sources. The Spice deck includes the parasitic resistances and capacitance associated with the network.

Once the Spice deck has been generated, the rules checker algorithm calls a Spice simulation routine, which simulates the circuit defined by the Spice deck. The Spice routine generates a Spice results file that comprises voltage waveform information relating to the simulation. The rules checker algorithm utilizes this waveform information to determine the RC delays of the network.

Other features and advantages of the present invention will become apparent from the following description, drawings and claims.

DETAILED DESCRIPTION OF THE INVENTION

Figure 1:
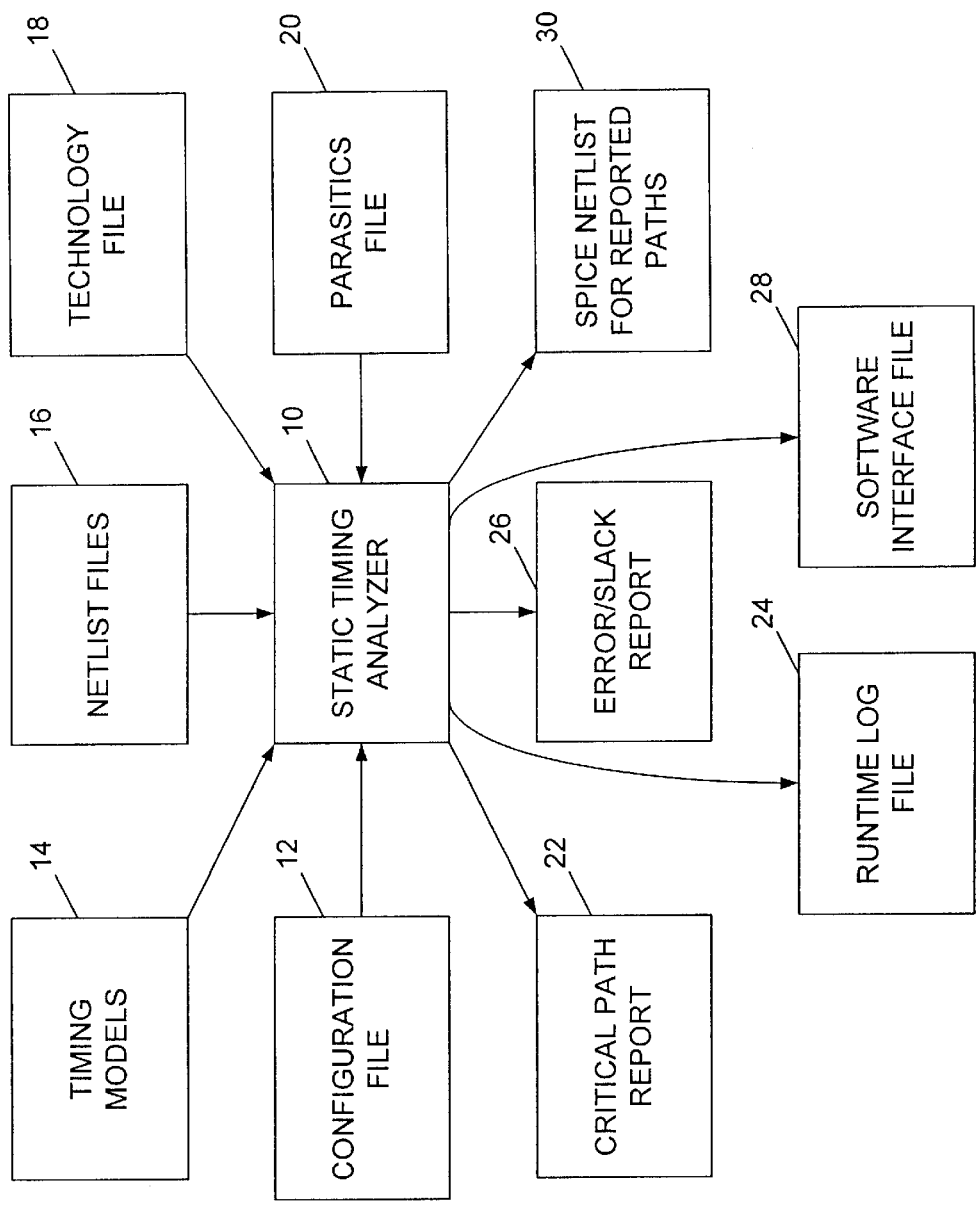
FIG. 1 is a block diagram of a static timing analyzer system, which is known in the prior art.

Having summarized various aspects of the present invention, reference will now be made in detail to the description of the invention as illustrated in the drawings. While the invention will be described in connection with these drawings, there is no intent to limit it to the embodiment or embodiments disclosed therein. On the contrary, the intent is to cover all alternatives, modifications and equivalents included within the spirit and scope of the invention as defined by the appended claims.

Referring now to the drawings, reference is made to FIG. 1, which is a block diagram of a prior art static timing analyzer program that illustrates the basic informational flow in such a system. Specifically, and as previously mentioned, one such system is marketed under the name PathMill. FIG. 1 is a diagram that illustrates the informational flow in the PathMill system. At the center of the diagram is a block denoted as static timing analyzer 10, which represents the PathMill program. Surrounding this block 10 are a number of other blocks that represent various input and output files and/or information.

More particularly, the PathMill program may utilize a configuration file 12, a file of timing models 14, one or more netlist files 16, a technology file 18, and a parasitic file 20, for various input information. In addition, the PathMill program may generate a number of different output files or other output information, including a critical path report 22, a runtime log file 24, an error report 26, a software interface file 28, and a SPICE netlist 30. When started, the PathMill program first processes the input netlist file(s) 16, the technology file 18, and the configuration files 12. The information from these files is subsequently used for performing path analyses. Since the PathMill program is publicly available and marketed, its function and operation are well known, and therefore need not be discussed in detail herein.

For purposes of illustrating the present invention, much of the diagram and information illustrated in FIG. 1 is not shown in connection with the inventive system. In this regard, reference is made to FIG. 2, which shows one embodiment of a system constructed in accordance with the present invention. In the illustrated embodiment, only the static timing analyzer 10, the configuration file 12 and the netlist file 16 of FIG. 1 are shown. The configuration file(s) 12 contains information that informs the static timing analyzer 10 how to perform its analysis, and various numbers of configuration files may be used. The netlist file 16, as is known, defines the various integrated circuit components, and their inter-relations.

Figure 2:
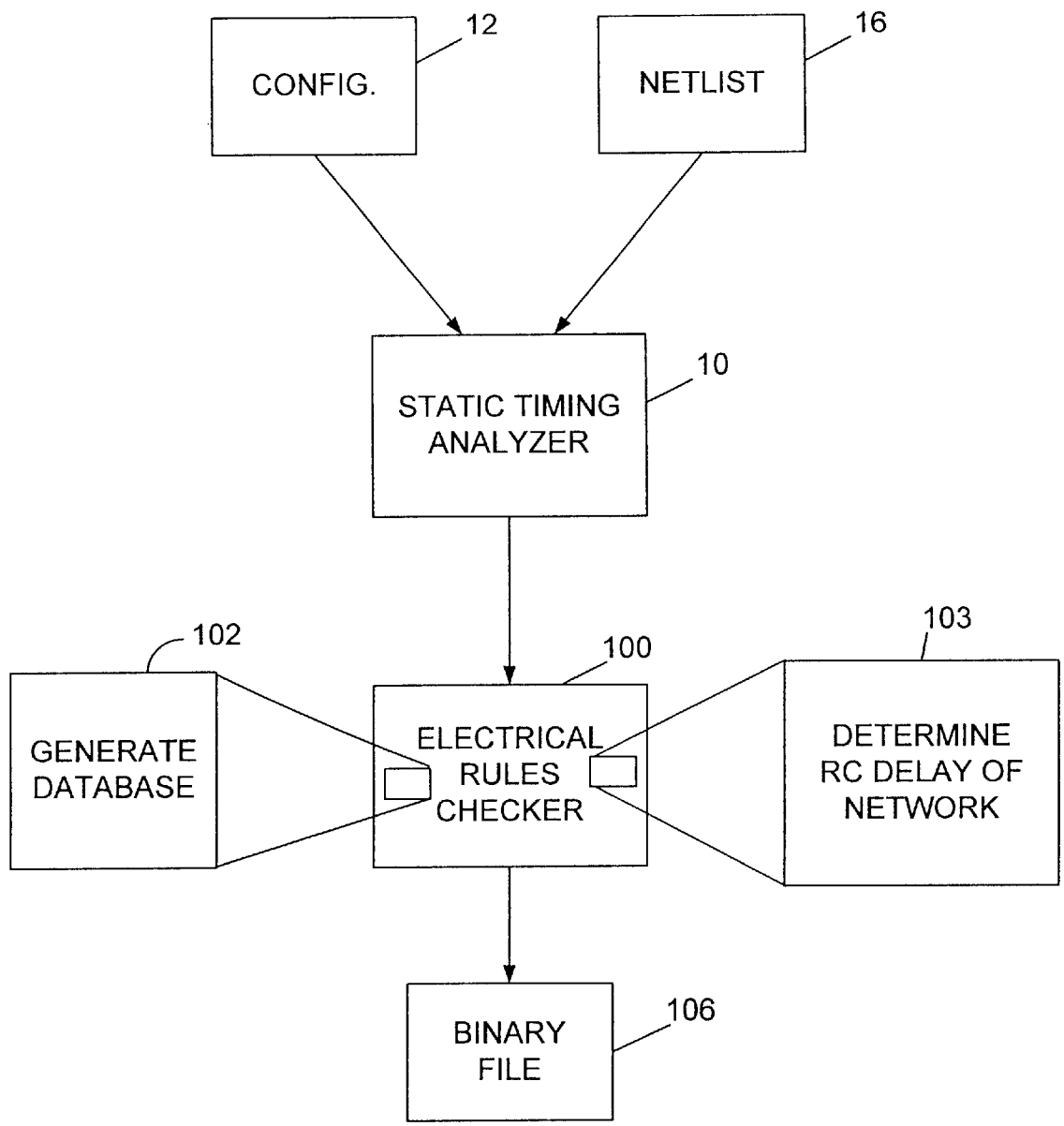
FIG. 2 is a block diagram illustrating the orientation of the electrical rules checker of the present invention in relation to an existing static timing analyzer.

The system shown in FIG. 2 preferably utilizes a computer (not shown) for its operation which runs the static timing analyzer program 10 and the electrical rules checker program 100. The computer may be electrically coupled to a memory device (not shown) which functions as a system storage unit for storing the code and data utilized and/or generated by the system. Those skilled in the art will realize that the present invention is not limited to any particular type of computer or memory device for performing these functions.

It should also be noted that the term "computer", as that term is used herein, is intended to denote any machine capable of performing the calculations, or computations, necessary to perform the tasks of the present invention. In essence, this includes any machine that is capable of accepting a structured input and of processing the input in accordance with prescribed rules to produce an output. Furthermore, those skilled in the art will understand that the system shown in FIG. 2 may be implemented in hardware, software, or a combination of both, and is not limited to any particular physical, structural, or electrical configuration.

The electrical rules checker 100 program of the present invention is preferably configured to operate on an output of the static timing analyzer 10. In this regard, the static timing analyzer may be configured to generate an output netlist database, which the electrical rules checker 100 of the present invention utilizes as an input. As previously mentioned, there are a wide variety of reasons why an electrical rules checking program may be desired. One such reason is to perform various checks over certain rules or strategies in an integrated circuit design. Such rules may vary from circuit to circuit, depending upon the particular application. For example, a portion of the electrical rules checker program 100 may operate to identify predischarge nodes in an integrated circuit design. This is only one example of the multitude of checks that may be performed by the electrical rules checker program 100 of the present invention.

As is known, a large scale integrated circuit design is often done at the FET level. A designer may utilize thousands of interconnected FETs in designing a portion of an integrated circuit. Although the designer may make every effort to follow certain design guidelines, mistakes may nevertheless be made. Accordingly, the electrical rules checker 100 of the present invention provides an excellent mechanism for double-checking designs and design layouts. Furthermore, the electrical rules checker 100 of the present invention may generate an output binary file 106, which may ultimately be used in subsequent executions of the electrical rules checker 100.

However, prior to the electrical rules checker 100 of the present invention performing any of the rules checking tasks, a database of nodes and elements of the circuit to be evaluated preferably is generated. This database is then utilized by the electrical rules checker 100 of the present invention to perform the rules checking tasks. The manner in which this database is generated will now be discussed below with respect to FIGS. 3A–3C.

For purposes of illustration, it will be assumed that the static timing analyzer 10, shown in FIG. 2 and discussed above, is the Pathmill static timing analyzer, in order to provide an example of one possible implementation of the present invention. However, those skilled in the art will understand that the electrical rules checker 100 of the present invention and the database of the present invention are not limited to use with any particular program.

The Pathmill static timing analyzer provides an application program interface (API) which allows the Pathmill static timing analyzer to communicate with the electrical rules checker 100 of the present invention. This API allows code external to the Pathmill program to be linked to the Pathmill program so that the external code and the Pathmill program itself comprise one executable which can be run as a single program. The electrical rules checker 100 of the present invention utilizes this API to obtain information from the Pathmill static timing analyzer which can be utilized by the electrical rules checker 100 to generate the database of the present invention, as indicated by block 102. This database is then utilized by the rules checker program 100 to perform the task 103 of determining the RC delays of networks in the integrated circuit.

Prior to the database of the present invention being generated, the Pathmill program runs and identifies circuit characteristics of the circuit under consideration such as, for example, FET direction, node types, latches, dynamic gates, clocks, rise and fall times, etc. Before the Pathmill program terminates, it calls the electrical rules checker 100 of the present invention. The Pathmill program has a feature commonly referred to as "hooks", which allows the Pathmill program to call routines at various stages of execution. Once the Pathmill program has finished identifying the characteristics mentioned above, the Pathmill program calls the electrical rules checker 100 of the present invention. The electrical rules checker 100 of the present invention, through this series of subroutine calls, creates its own database of the circuit under consideration.

Figure 3A:
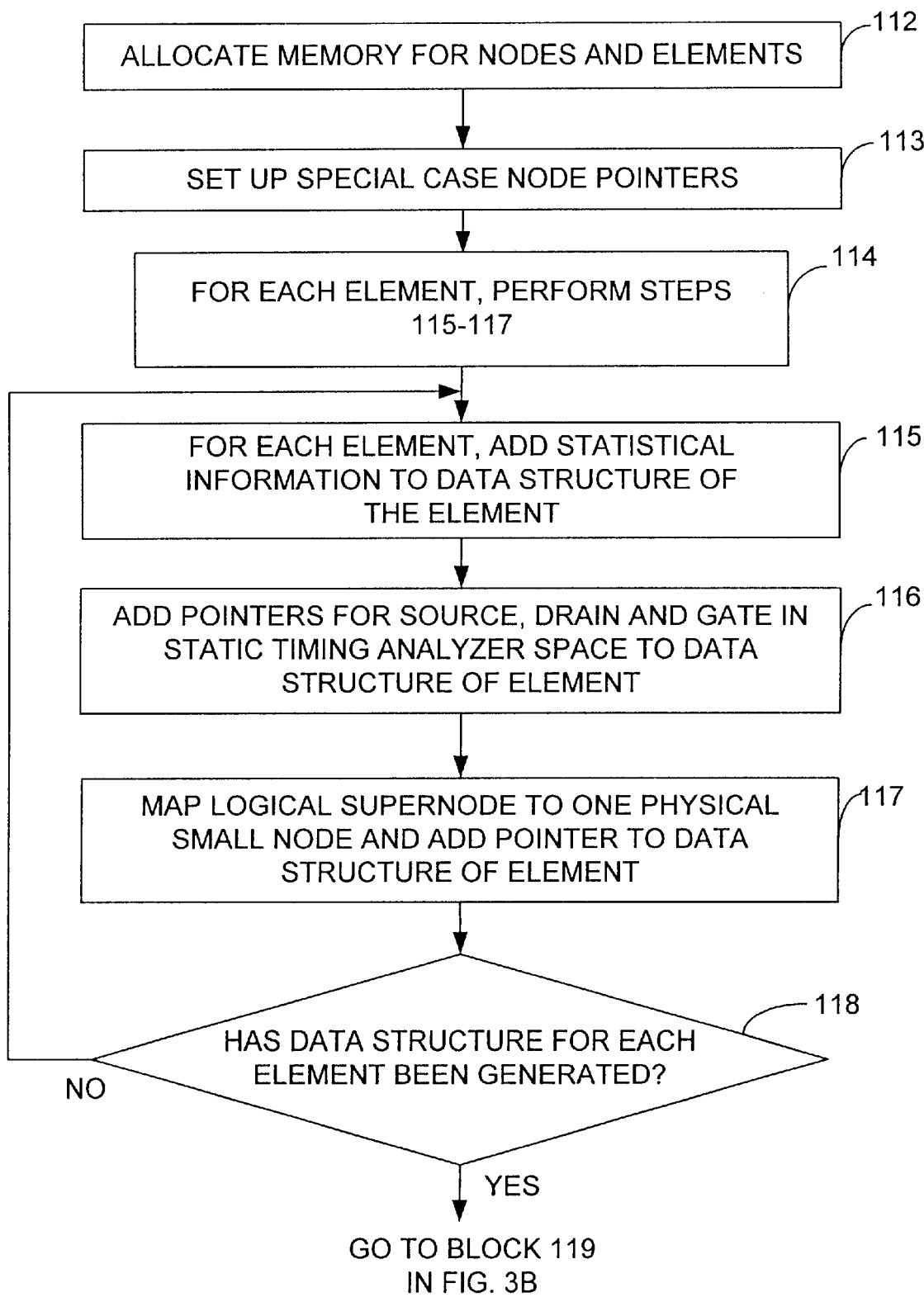
FIGS. 3A–3C together form a flow chart which illustrates the method of the present invention for generating the database of the present invention which can be utilized by the electrical rules checker of the present invention shown in FIG. 2 to perform rules checking tasks.
Figure 3B:
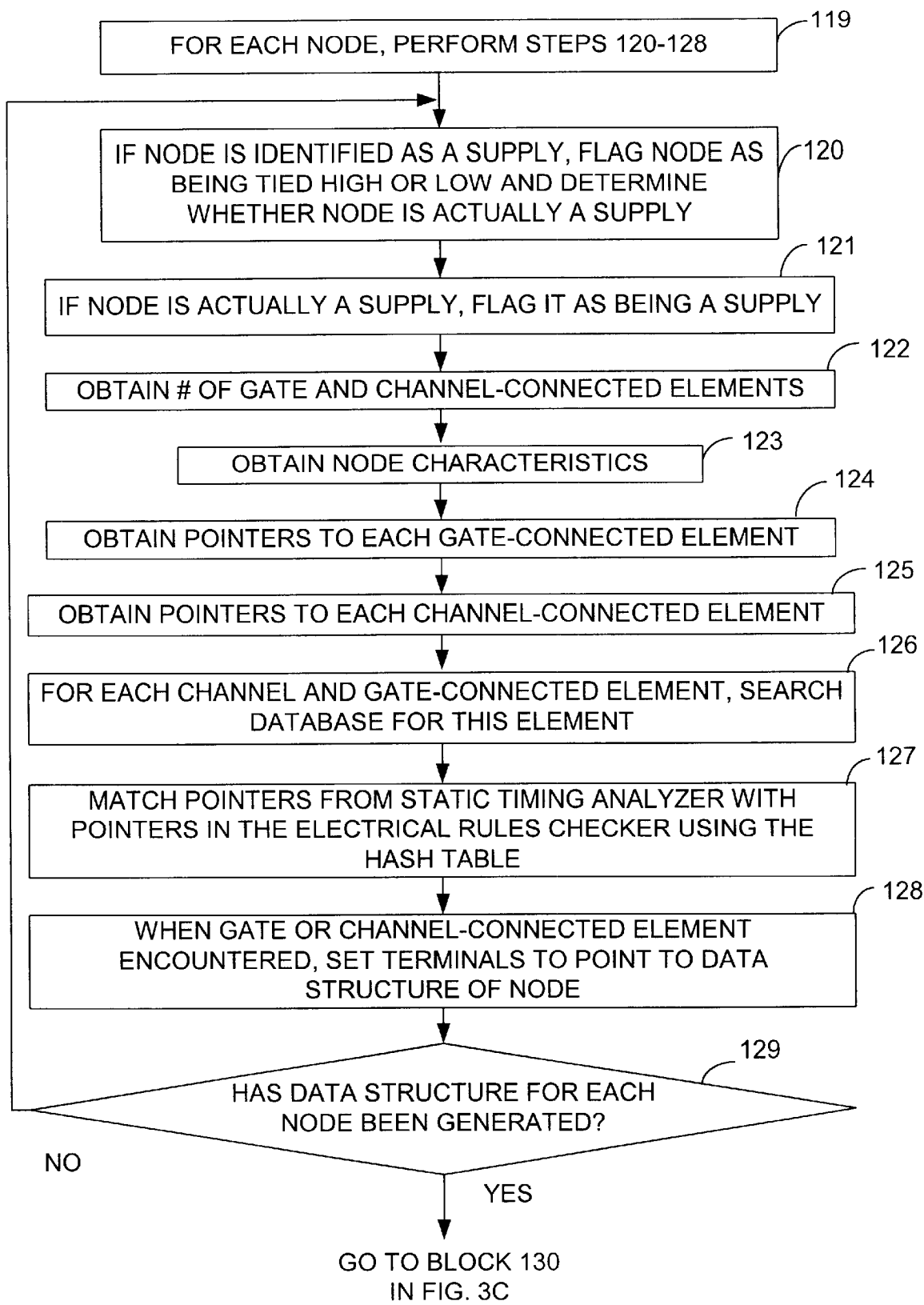

The first step in the process of generating the database is to allocate memory for the nodes and elements of the circuit, as indicated by block 112 in FIG. 3A. The Pathmill program provides information via its API about the number of elements and nodes in the circuit of the electrical rules checker 100 and this information is utilized by the electrical rules checker 100 to perform memory allocation. Certain types of nodes and elements do not require as much information about their characteristics as do other types of nodes and elements. Therefore, the amount of memory allocated may vary for different types of nodes and elements. Rather than merely basing memory allocation on the number of nodes and elements in the circuit, it may be desirable to distinguish between different types of nodes and elements so that memory can be more efficiently allocated.

However, it will be apparent to those skilled in the art that the present invention is not limited with respect to the manner in which memory space is allocated for the nodes and elements. Those skilled in the art will understand the manner in which the memory allocation task, and any optimizations of it, can be performed. Therefore, in the interest of brevity, a detailed discussion of the memory allocation task for the nodes and elements will not be provided herein.

Once memory has been allocated for the nodes and elements, the next step in the process of the present invention is to set up node pointers for special cases of nodes, as indicated by block 114. These special types of nodes will be used repeatedly during the process of generating the database, as discussed below in more detail. Therefore, the pointers for these nodes preferably are set up relatively early in the database generation process. For example, nodes which correspond to ground (GND) and to the supply voltage ($V_{DD}$) are special types of nodes and it is helpful to set up node pointers for these types of nodes. However, those skilled in the art will understand that this step, although it is preferable, is not necessary, but rather, is used to optimize efficiency in the database generation process of the present invention.

For each element, a data structure must be generated which can be utilized by the electrical rules checker 100 in performing the rules checking tasks. Steps 115–117 in FIG. 3A correspond to the steps for creating the element data structures. For each element, a data structure is defined and statistical information relating to the element is added to the data structure of the element, as indicated by block 115. This information includes, for example, the width of the element, the length of the element, the direction of the element, and the element type.

Once the statistical information has been included in the data structure of the the pointers for the source, drain and gate of each element, as defined in the space of the static timing analyzer, are included in the data structure of the element, as indicated by block 116. The pointers that were set up in step 114 are utilized in step 116. If either the source, drain or gate of the element is attached to ground or VDD, then the pointers for the source, drain and gate are set to the pointers for ground or VDD obtained in step 114.

A node in a circuit can be represented logically or physically. A logical representation of an element includes only FETs and does not include any resistors. This logical representation is identified in the Pathmill program as a "supernode". The logical representation does not account for parasitic resistance. On the other hand, a physical representation of a node, which is identified in the Pathmill program as a small node, includes FETs, but also includes resistors, which correspond to the parasitic resistance in the node. Therefore, in the physical representation, a small node exists between the resistors representing the parasitic resistance and between any FET and any one of the resistors. Each element has a pointer to a supernode and to a small node for each drain, source and gate. Therefore, there are six pointers for each FET.

All of the small nodes in the physical representation map to the same supernode in the logical representation. In Pathmill, the supernode of the logical representation is mapped to one of the physical small nodes, and vice versa. In block 117, the pointers corresponding to these nodes are added to the data structure of the element.

Once the data structures for the elements have been generated, the data structures for the nodes must be generated. Blocks 120–128 in FIG. 3B correspond to the steps in the process of the present invention for generating the data structures of the nodes. In block 120, a determination is made as to whether a node has been identified by the Pathmill program as a supply. The Pathmill program identifies all nodes as supplies if the nodes are either tied high or low. If the node has been identified by the Pathmill program as corresponding to a supply, the node is flagged and the flag will indicate whether the node is tied high or whether it is tied low. A determination is then made as to whether the node is actually a supply, i.e., whether the node actually corresponds to ground or $V_{DD}$. If a determination is made that the node is actually a supply, the node is flagged as corresponding to a supply, as indicated by block 121.

The electrical rules checker 100 then obtains the number of gate-connected elements and the number of channel-connected elements from the static timing analyzer, as indicated by block 122. The electrical rules checker 100 also obtains the characteristics of the nodes from the static timing analyzer 10, as indicated by block 123. These characteristics include, for example, capacitance, node type, rise and fall time, etc. Once the characteristics of the node have been obtained, the electrical rules checker 100 obtains the pointers provided by the static timing analyzer 10 that point to each gate-connected element, as indicated by block 124. The electrical rules checker 100 then obtains the pointers from the static timing analyzer which point to each channel-connected element, as indicated by block 125. Then, for each channel-connected element and for each gate-connected element, the electrical rules checker 100 searches its database to find an element in the space of the electrical rules checker 100 that corresponds to the element under consideration, as indicated by block 126.

The pointers for the elements provided by the static timing analyzer 10 are then matched with the pointers for the corresponding elements in the electrical rules checker 100 using a hash table which converts the pointers in the space of the static timing analyzer 10 into pointers in the space of the electrical rules checker 100, as indicated by block 127. Generally, each of the pointers in the space of the static timing analyzer corresponds to a hash key and when the hash key is plugged into the hash table, the pointer in the space of the electrical rules checker is output from the hash table. Hash tables and the manner in which they are utilized are well-known in the art. Therefore, a detailed discussion of the manner in which the pointers in the space of the static timing analyzer are converted using the hash table into pointers in the space of the electrical rules checker 100 will not be provided herein since persons skilled in the art will understand the manner in which this can be accomplished.

Once these steps have been performed, the electrical rules checker 100 has at its disposal a list of channel-connected elements and gate-connected elements as well as their pointers in the space of the electrical rules checker 100. In generating the node data structures, when the electrical rules checker 100 encounters a node that is connected to one of these channel-connected or gate-connected elements, the electrical rules checker 100 sets the terminals of the element to point to the data structure of the node under consideration, as indicated by block 128. The process then returns to the step in block 120 and generation of the data structure for the next node begins, as indicated by decisional block 129.

Figure 3C:
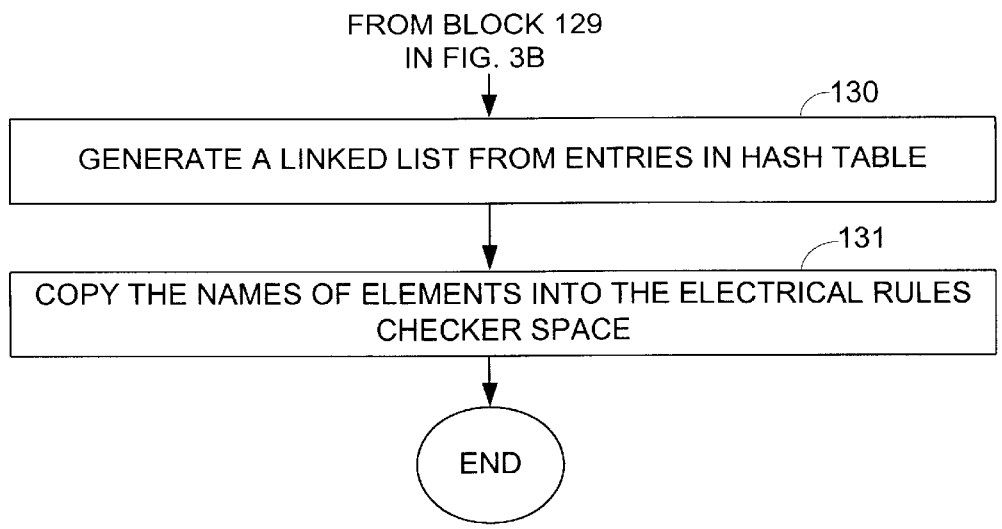

In order to enable the electrical rules checker 100 to maximize efficiency in searching the database of the present invention, once the data structures for all of the nodes have been created, a linked list is generated from the entries in the hash table, as indicated by block 130 in FIG. 3C. Every location in the hash table will not contain a valid entry. Therefore, in order to maximize efficiency in searching the database, a linked list is generated which links the valid entries in the hash table together such that each valid entry in the hash table points to the next valid entry in the hash table, as indicated by block 130. Thus, when the electrical rules checker 100 of the present invention is searching for an element in the database of the present invention, the electrical rules checker 100 simply analyzes the elements contained in the linked list.

It should be noted that the arrangement of the elements in the linked list may or may not have any physical relationship to the arrangement of the elements in the circuit under consideration. Thus, the linked list is merely used to search through the elements stored in the database. Once the linked list has been generated, the names of the elements contained in the linked list are copied into electrical rules checker space, as indicated by block 131. This reduces the number of calls that need to be made to the Pathmill program by the electrical rules checker 100. Once the database of the present invention has been generated, no more calls have to be made to the Pathmill program via the Pathmill. The database of the present invention is comprised as the binary file 106 shown in FIG. 2.

Once the database of the present invention has been generated in the manner described above, the electrical rules checker 100 of the present invention utilizes this database to perform the rules checking tasks. However, it should be noted that the generation of the database is not critical to the present invention, as will be understood by those skilled in the art. Utilization of the database of the present invention enables the rules checker 100 to maximize efficiency in performing its tasks and reduces the number of API calls to the timing analyzer 10.

In accordance with the present invention, the electrical rules checker 100 evaluates a circuit to determine the RC delays of networks of the circuit. This task is represented by block 103 in FIG. 2. The electrical rules checker 100 of the present invention receives information relating to the netlist 16 read by the static timing analyzer 10 (e.g., the Pathmill program) and utilizes the netlist 16 when generating the database of the present invention. The electrical rules checker 100 then utilizes the database to determine the RC delays associated with a network of nodes contained in the integrated circuit. The manner in which the electrical rules checker 100 determines the RC delays will be discussed below with reference to FIGS. 4A–5.

Figure 4A:
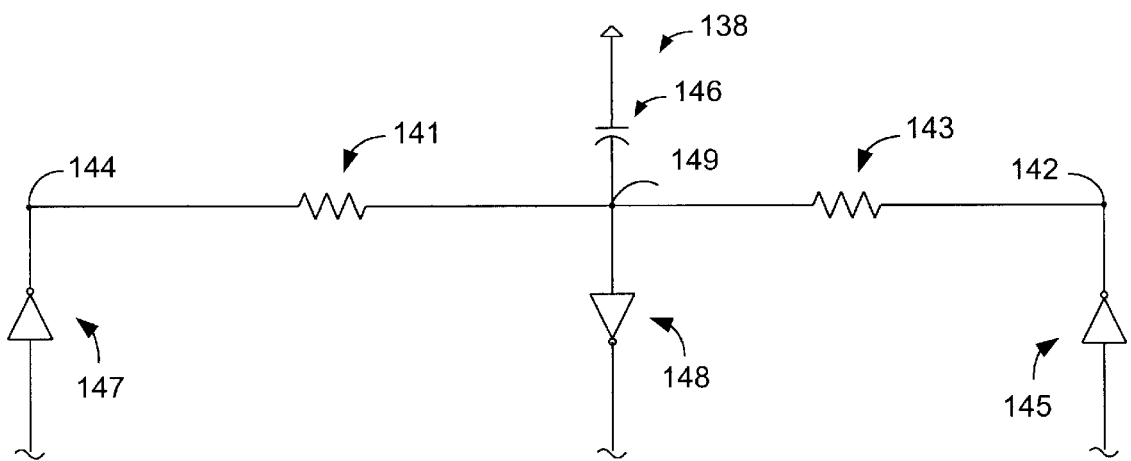
FIG. 4A is a schematic block diagram of an example of a typical network which the electrical rules checker of the present invention shown in FIG. 2 will evaluate to determine the RC delays of the network.

FIG. 4A is a schematic block diagram of a circuit 138 for which the RC delays will be determined in order to exemplify the method of the present invention. However, those skilled in the art will understand that the present invention is not limited with respect to the type of circuit with which the method and apparatus of the present invention may be utilized. The circuit 138 shown in FIG. 4A comprises a plurality of driver gates 145 and 147 and a receiver gate 148. Each of the gates 145, 147 and 148 is comprised of a plurality of FETs (not shown), as will be understood by those skilled in the art. The parasitic resistances contained in the circuit 138 are represented by resistors 141 and 143. The parasitic capacitance 146 associated with the circuit is represented by the capacitor 146. The output nodes of the network 142 and 144 correspond to the outputs of the driver gates 145 and 147, respectively.

As stated above with reference to FIG. 1, the static timing analyzer 10, e.g., the Pathmill program, reads a netlist 16. When the electrical rules checker 100 performs the task of generating the database 102, the electrical rules checker 100 utilizes information associated with this netlist 16, which contains information relating to the parasitic resistances and capacitances of the nodes in the circuit. As discussed above in relation to FIGS. 3A–3C, the data structures for the nodes and elements contained in the database include this information. The electrical rules checker 100 uses the database to generate a Spice deck for the circuit 138, which is then used to simulate the circuit 138.

It should be noted that it is not necessary for the electrical rules checker 100 to utilize the database to determine the RC delays. The electrical rules checker 100 may instead determine the RC delays by simply using information associated with the netlist 16 provided to the electrical rules checker 100 by the static timing analyzer 10. However, utilizing the database enables the rules checker 100 to expedite the evaluation tasks, as discussed above with reference to FIGS. 3A–3C.

Figure 4B:
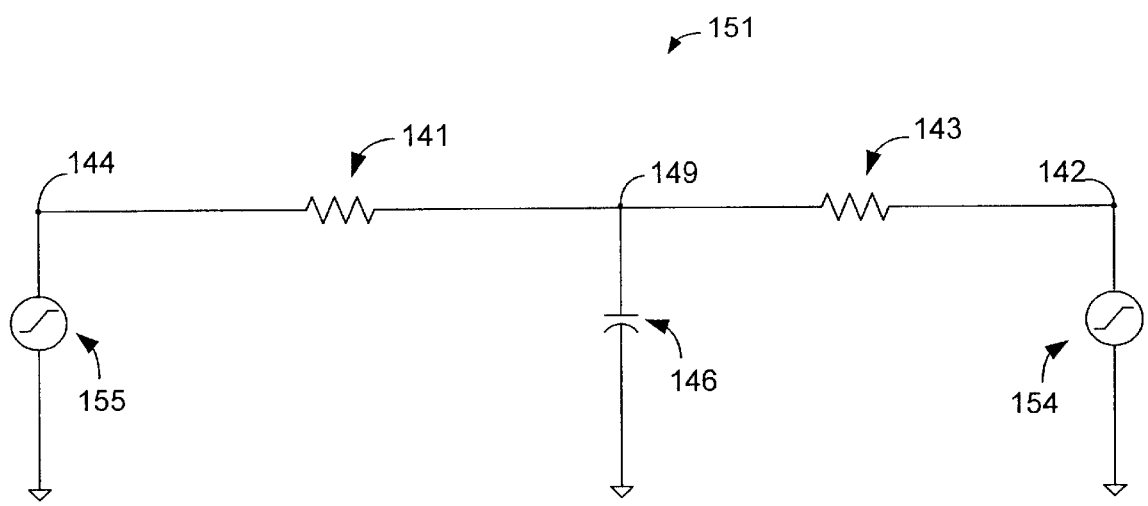
FIG. 4B is a schematic block diagram of a Spice deck corresponding to the network shown in FIG. 4A which will be used to simulate the network shown in FIG. 4A to determine the RC delays associated with the network.

The circuit 151 shown in FIG. 4B corresponds to the Spice deck generated by the electrical rules checker 100. In the Spice deck, the driver gates 145 and 147 are represented by voltage sources 154 and 155, respectively, which correspond to ramp functions. The Spice deck includes control information which identifies the voltage sources 154 and 155 as ramp functions. The control information also defines the timing of the ramp functions and indicates that the voltage sources 154 and 155 are connected to ground. The control information indicates that the ramp functions are synchronized, i.e., the phase and magnitude of waveforms are identical.

Once the Spice deck has been generated, the electrical rules checker 100 calls the Spice routine, which simulates the circuit 151 specified by the Spice deck. During the simulation, the Spice routine generates a Spice results, or raw, file. The Spice results file contains information defining the voltage waveforms at each point in time at each of the output nodes of the network 142 and 144 and at the input node of the network 149. The electrical rules checker 100 extracts this waveform and the associated timing information from the Spice results file and evaluates the information to determine the RC delays of the network.

In order to determine the RC delays, the electrical rules checker 100 analyzes the waveform at output node 142 and the waveform at input node 149 and determines the difference in time between a particular point on the waveform at node 142 (e.g., the midpoint) and the same point on the waveform at node 149. Since the same waveform is applied to all output nodes, it is only necessary for the electrical rules checker 100 to calculate the difference between the waveforms at the input node 149 and either one of the output nodes 142 and 144. These differences in time between the waveforms correspond to the respective RC delays between each respective output node 142 and 144 and the input node 149.

Figure 5:
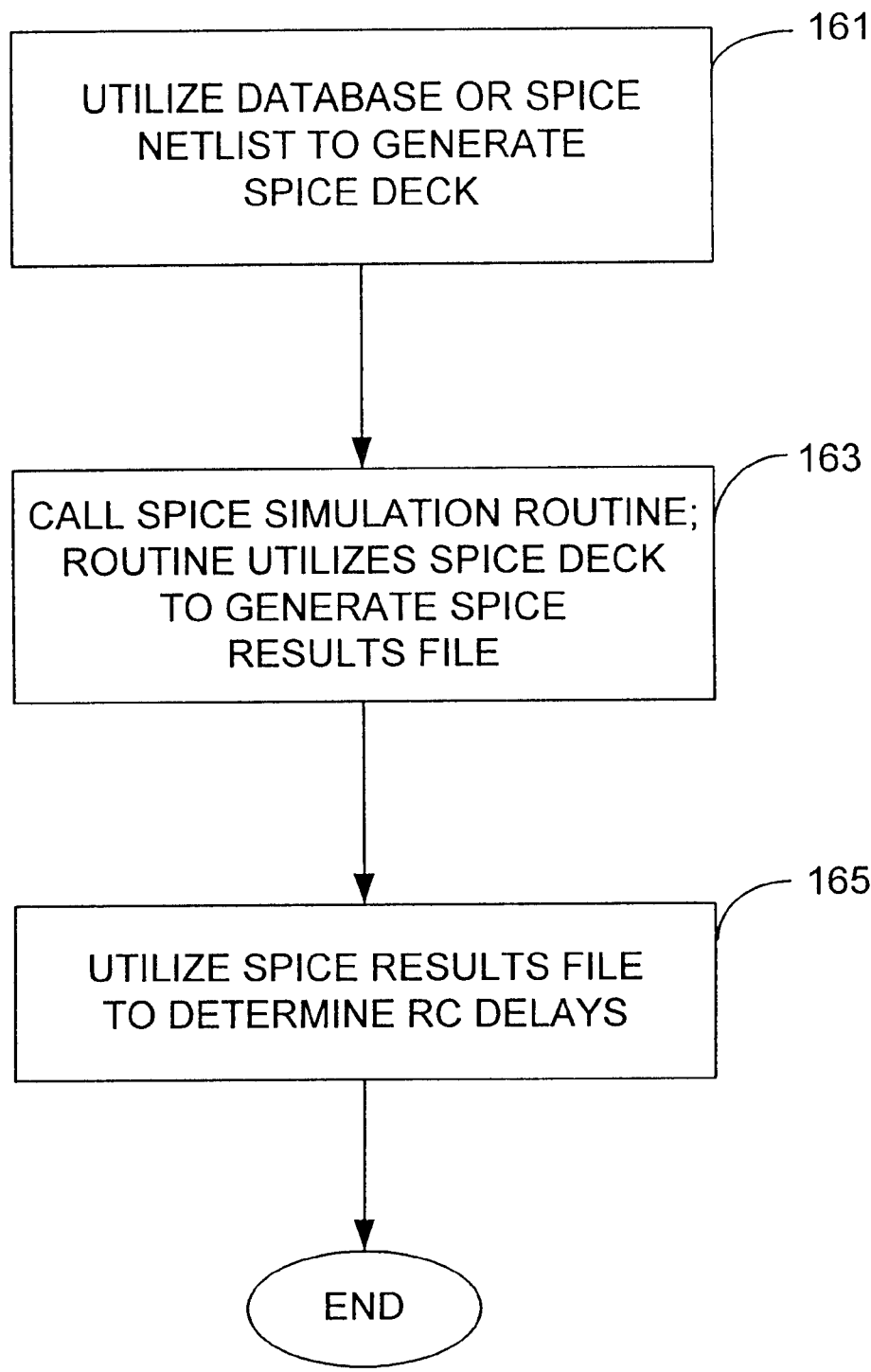
FIG. 5 is a flow chart illustrating the preferred method of the present invention utilized by the electrical rules checker for determining the RC delays associated with the network shown in FIG. 4A.

Once the RC delays have been determined, the electrical rules checker 100 can utilize the RC delays to determine whether or not the RC delays comply with design specifications. FIG. 5 is a flow chart illustrating the process performed by the electrical rules checker 100 in determining the RC delays of a network. The electrical rules checker 100 first generates the Spice deck which will be used to simulate the circuit, as indicated by block 161. As stated above, the electrical rules checker 100 may utilize the database to generate the Spice deck, or it may generate the Spice deck directly from the netlist 16. The rules checker 100 will then call the Spice routine, which will utilize the Spice deck to simulate the circuit, as indicated by block 163. During the simulation, the Spice routine will generate a Spice results, or raw, file. The electrical rules checker 100 will then utilize the Spice results file to determine the RC delays between the output nodes of the network and the input node of the network, as indicated by block 165.

Although the electrical rules checker 100 preferably utilizes a Spice routine for simulating the Spice deck specified by the electrical rules checker 100, it will be understood by those skilled in the art that simulation routines other than Spice can be used by the electrical rules checker 100 for the purpose of simulating the network and generating the results file. It should also be noted that, although the voltage sources utilized to simulate the drivers of the network preferably are characterized as ramp functions, other functions, such as step functions, or more complex piece-wise linear approximations, may also be used for this purpose. Those skilled in the art will understand the manner in which such functions can be utilized for the purpose of determining the RC delays of a network.

It should be noted that the foregoing description is not intended to be exhaustive or to limit the invention to the precise forms disclosed. Those skilled in the art will understand that modifications or variations are possible in light of the above teachings, which are within the scope of the present invention. In this regard, the embodiment discussed above was chosen and described to provide the best illustration of the principles of the invention and its practical application to thereby enable one of ordinary skill in the art to utilize the invention in various embodiments and with various modifications as are suited to the particular use contemplated. All such modifications and variations are within the scope of the invention.

What is claimed is:

1. An apparatus for determining RC delays associated with one or more output nodes of a network and an input node of the network, the network being comprised in an integrated circuit, the apparatus comprising:

logic configured to perform a rules checker algorithm, wherein when the rules checker algorithm is performed, the rules checker algorithm analyzes information relating to the network to determine an RC delay between each output node of the network and the input node of the network, and said logic receives information associated with a netlist from a static timing analyzer, the netlist comprising the information relating to the network, the information describing parasitic resistance and capacitance characteristics of the network, the rules checker algorithm utilizing information associated with the netlist to generate a Spice deck associated with the network, the Spice deck including control information which describes a manner in which the network is to be simulated, the rules checker algorithm calling a Spice simulation routine which utilizes the Spice deck to simulate the network, the Spice simulation routine generating a Spice results file which comprises voltage waveform information, the voltage waveform information describing voltage waveforms at each output node and at the input node, the rules checker algorithm comparing the waveform at one of the output nodes with the waveform at the input node to determine any RC delays between the output node and the input node.

2. The apparatus of claim 1, wherein the logic is a computer which is configured to execute the rules checker algorithm, the rules checker algorithm corresponding to a rules checker computer program, wherein prior to generating the Spice deck, the program utilizes the information relating to the netlist to generate a database, the database comprising the information relating to the netlist, and wherein the program utilizes the database to generate the Spice deck.

3. The apparatus of claim 1, wherein the network comprises a plurality of driver gates and a receiver gate, wherein each output node corresponds to an output of one of the driver gates, the input node corresponding to an input of the receiver gate, and wherein the Spice deck substitutes a voltage source for each of the driver gates, each voltage source being characterized by the control information as a ramp function, the control information indicating that the voltage sources are in phase such that waveforms corresponding to the voltage sources are equal in phase at any point in time, the program comparing the waveform of one of the voltage sources with the waveform at the input node at a particular point in time and determining the difference in time between the waveforms, the difference in time corresponding to the RC delays between the input node and each respective output node.

4. A method for determining RC delays associated with one or more output nodes of a network and an input node of the network, the network being comprised in an integrated circuit, the method comprising the steps of:

analyzing information relating to the network to determine an RC delay between each output node of the network and the input node of the network, wherein the information relates to a netlist read by a static timing analyzer, the netlist comprising information relating to the network, the information relating to the network describing parasitic resistance and capacitance characteristics of the network, the analyzing step further comprising the steps of:

utilizing the information relating to the netlist to generate a Spice deck associated with the network, the Spice deck including control information which describes a manner in which the network is to be simulated;

utilizing a Spice simulation routine to simulate the network, the Spice simulation routine utilizing the Spice deck to simulate the network, the Spice simulation routine generating a Spice results file which comprises voltage waveform information, the voltage waveform information describing voltage waveforms at each output node and at the input node; and comparing the waveform at one of the output nodes with the waveform at the input node to determine any RC delays between the output nodes and the input node.

5. The method of claim 4, wherein prior to generating the Spice deck, a database is generated, the database comprising the information relating the netlist, and wherein the database is utilized to generate the Spice deck.

6. The method of claim 4, wherein the network comprises a plurality of driver gates and a receiver gate, wherein each output node corresponds to an output of one of the driver gates, the input node corresponding to an input of the receiver gate, and wherein the Spice deck substitutes a voltage source for each of the driver gates, each voltage source being characterized by the control information as a ramp function, the control information indicating that the voltage sources are in phase such that waveforms corresponding to the voltage sources are equal in phase at any point in time, and wherein during the comparing step, the waveforms of one of the voltage sources are compared with the waveform at the input node at a particular point in time and the difference in time between the waveforms are determined, the difference in time corresponding to the RC delays between the input node and each respective output node.

7. A computer program for determining RC delays associated with one or more output nodes of a network and an input node of the network, the network being comprised in an integrated circuit, the computer program being embodied on a computer-readable medium, the program comprising:

code which analyzes information relating to the network to determine an RC delay between each output node of the network and the input node of the network, wherein the information relates to a netlist read by a static timing analyzer, the netlist comprising the information relating to the network, the information describing parasitic resistance and capacitance characteristics of the network, the code comprising:

a first code segment which utilizes the information relating to the netlist to generate a Spice deck associated with the network, the Spice deck including control information which describes a manner in which the network is to be simulated;

a second code segment which calls a Spice simulation routine to simulate the network, the Spice simulation routine utilizing the Spice deck to simulate the network, the Spice simulation routine generating a Spice results file which comprises voltage waveform information, the voltage waveform information describing voltage waveforms at each output node and at the input node; and a third code segment which utilizes the Spice results file to compare the waveform at one of the output nodes with the waveform at the input node to determine any RC delays between the output nodes and the input node.

8. The computer program of claim 7, wherein prior to generating the Spice deck, the first code segment generates a database, the database comprising the information relating the netlist, and wherein the database is utilized by the first code segment to generate the Spice deck.

9. The computer program of claim 7, wherein the network comprises a plurality of driver gates and a receiver gate, wherein each output node corresponds to an output of one of the driver gates, the input node corresponding to an input of the receiver gate, and wherein the Spice deck substitutes a voltage source for each of the driver gates, each voltage source being characterized by the control information as a ramp function, the control information indicating that the voltage sources are in phase such that waveforms corresponding to the voltage sources are equal in phase at any point in time, and wherein the third code segment compares the waveform of one of the voltage sources with the waveform at the input node at a particular point in time and determines the difference in time between the waveforms, the difference in time corresponding to the RC delays between the input node and each respective output node.

10. An apparatus for determining RC delays associated with one or more output nodes of a network and an input node of the network, the network being comprised in an integrated circuit, the apparatus comprising:

a first means for analyzing information relating to the network to determine an RC delay between each output node of the network and the input node of the network, wherein the information relates to a netlist generated by a second means for performing a static timing analysis, the netlist comprising information relating to the network, the information relating to the network describing parasitic resistance and capacitance characteristics of the network, said first means utilizing the netlist to generate a Spice deck associated with the network, the Spice deck including control information which describes a manner in which the network is to be simulated, said first means utilizing a Spice simulation routine to simulate the network, the Spice simulation routine utilizing the Spice deck to simulate the network, the Spice simulation routine generating a Spice results file which comprises voltage waveform information, the voltage waveform information describing voltage waveforms at each output node and at the input node, said first means comparing the waveform at one of the output nodes with the waveform at the input node to determine any RC delays between the output nodes and the input node.

11. The apparatus of claim 10, wherein prior to generating the Spice deck, said first means generates a database, the database comprising the information relating to the netlist, and wherein the database is utilized by said first means to generate the Spice deck.

12. The apparatus of claim 10, wherein the network comprises a plurality of driver gates and a receiver gate, wherein each output node corresponds to an output of one of the driver gates, the input node corresponding to an input of the receiver gate, and wherein the Spice deck substitutes a voltage source for each of the driver gates, each voltage source being characterized by the control information as a ramp function, the control information indicating that the voltage sources are in phase such that waveforms corresponding to the voltage sources are equal in phase at any point in time, and wherein said first means compares the waveform of one of the voltage sources with the waveform at the input node at a particular point in time and determines the difference in time between the waveforms, the difference in time corresponding to the RC delays between the input node and each respective output node.

13. A method for determining RC delays of a network circuit, comprising the steps of:

allocating memory for each circuit node and for each circuit element of a circuit to be analyzed;

setting up a special-case pointer for each special-case circuit node of said circuit;

defining an element at a structure for each circuit element of said circuit;

adding statistical information to said element data structure;

adding to said element data structure a terminal pointer for each source, drain, and gate defined in the space of a static timing analyzer for each circuit element of said circuit;

adding to said element data structure a mapping pointer corresponding to the mapping of each supernode to each physical small node for each circuit node of said circuit;

flagging each circuit node of said circuit that is identified as a supply node and maintaining said flagging if it is determined that said circuit node is actually a supply node;

obtaining a first value corresponding to the quantity of gate-connected circuit elements defined in the space of said timing analyzer;

obtaining a second value corresponding to the quantity of channel-connected circuit elements defined in the space of said timing analyzer;

obtaining node characteristics of each circuit node of said circuit;

obtaining a channel-connected element pointer for each channel-connected circuit element;

obtaining a gate-connected element pointer for each gate-connected circuit element;

searching an element database for an element corresponding to each channel-connected circuit element and to each gate-connected circuit element;

matching said special-case pointers, said terminal pointers, said mapping pointers, said channel-connected element pointers, and said gate-connected pointers to corresponding pointers from said static analyzer using a hash table;

defining a node data structure for each channel-connected circuit node and for each gate-connected circuit node;

generating a linked list from said element data structures and from said node data structures using said hash table;

obtaining a name for each circuit node and for each circuit element of said circuit;

copying said linked list and said names into a database file;

utilizing at least one of said database file and a netlist to generate an input file for a circuit simulation routine;

executing said circuit simulation routine using said input file to generate a result file from said circuit simulation routine; and utilizing said result file to determine RC delays of said circuit to be analyzed.

14. The method of claim 13, wherein said step of utilizing said result file to determine RC delays of said circuit to be analyzed comprises comparing the output waveform of each output of said circuit to the input waveform of each input of said circuit.

* * * * *